(12) United States Patent
Takahashi et al.

(10) Patent No.: US 10,190,024 B2
(45) Date of Patent: Jan. 29, 2019

(54) POLISHING COMPOSITION

(71) Applicant: FUJIMI INCORPORATED, Kiyosu-shi, Aichi (JP)

(72) Inventors: Shuhei Takahashi, Aichi (JP); Masatoshi Tomatsu, Aichi (JP)

(73) Assignee: FUJIMI INCORPORATED, Kiyosu-shi (JP)

( * ) Notice: Subject to any disclaimer, the term of this patent is extended or adjusted under 35 U.S.C. 154(b) by 0 days.

(21) Appl. No.: 15/519,578

(22) PCT Filed: Oct. 15, 2015

(86) PCT No.: PCT/JP2015/005217
§ 371 (c)(1),
(2) Date: Apr. 17, 2017

(87) PCT Pub. No.: WO2016/063505
PCT Pub. Date: Apr. 28, 2016

(65) Prior Publication Data
US 2017/0247574 A1  Aug. 31, 2017

(30) Foreign Application Priority Data
Oct. 22, 2014 (JP) .................. 2014-215744

(51) Int. Cl.
*C09G 1/02* (2006.01)
*C09G 1/18* (2006.01)
*B24B 37/00* (2012.01)
*C09K 3/14* (2006.01)
*H01L 21/304* (2006.01)
*H01L 21/321* (2006.01)

(52) U.S. Cl.
CPC ............... *C09G 1/18* (2013.01); *B24B 37/00* (2013.01); *C09G 1/02* (2013.01); *C09K 3/14* (2013.01); *C09K 3/1436* (2013.01); *C09K 3/1463* (2013.01); *H01L 21/304* (2013.01); *H01L 21/321* (2013.01)

(58) Field of Classification Search
CPC .................................................. C11D 11/0047
USPC .................................................. 510/175, 176
See application file for complete search history.

(56) References Cited

U.S. PATENT DOCUMENTS

| | | |
|---|---|---|
| 4,588,421 A | 5/1986 | Payne |
| 6,139,763 A | 10/2000 | Ina et al. |
| 2003/0064671 A1 | 4/2003 | Pasqualoni et al. |
| 2004/0127047 A1 | 7/2004 | Yamada et al. |
| 2005/0204639 A1 | 9/2005 | Ishihara |
| 2005/0205837 A1 | 9/2005 | Miwa |
| 2006/0135045 A1 | 6/2006 | Bian et al. |
| 2007/0269987 A1 | 11/2007 | Nakano et al. |
| 2010/0112906 A1 | 5/2010 | Liu |
| 2012/0190199 A1 | 7/2012 | Reiss et al. |
| 2013/0260650 A1 | 10/2013 | Shinoda et al. |
| 2014/0363973 A1* | 12/2014 | Kanamaru ............... C09G 1/02 438/693 |
| 2015/0210891 A1 | 7/2015 | Tsuchiya et al. |
| 2015/0315418 A1* | 11/2015 | Umeda ................... C09G 1/02 252/79.1 |

FOREIGN PATENT DOCUMENTS

| | | |
|---|---|---|
| EP | 1 006 166 A1 | 6/2000 |
| EP | 1 403 351 A1 | 3/2004 |
| FR | 2879617 A1 | 6/2006 |
| JP | S62-030333 A | 2/1987 |
| JP | 2005-268667 A | 9/2005 |
| JP | 2006-231436 A | 9/2006 |
| JP | 2010-080864 A | 4/2010 |
| JP | 2010-114446 A | 5/2010 |
| JP | 2013-140646 A | 7/2013 |
| JP | 2014-041978 A | 3/2014 |
| JP | 2014-187268 A | 10/2014 |
| WO | WO-2004/100242 A1 | 11/2004 |
| WO | WO-2009/104465 A1 | 8/2009 |
| WO | WO-2012/063757 A | 5/2012 |
| WO | WO-2012/099845 A2 | 7/2012 |

* cited by examiner

*Primary Examiner* — Gregory E Webb
(74) *Attorney, Agent, or Firm* — Foley & Lardner LLP

(57) ABSTRACT

Provided is a polishing composition capable of keeping a good polishing removal rate stably. The polishing composition includes silica particles as abrasives and a basic compound as a polishing removal accelerator. The silica particles have a density of silanol groups that is 1.5 to 6.0 pieces/nm$^2$. The polishing composition has an adsorption ratio parameter A that is 1.2 or less, the adsorption ratio parameter representing concentration dependency of an amount of adsorption of the basic compound to the silica particles as the ratio of high-concentration adsorption amount/low-concentration adsorption amount.

20 Claims, No Drawings

POLISHING COMPOSITION

TECHNICAL FIELD

The present invention relates to polishing compositions. Specifically the present invention relates to polishing compositions preferably used for polishing of semiconductor substrates such as a silicon wafer mainly and other objects to be polished.

BACKGROUND ART

Fine polishing is performed using polishing liquid to the surface of materials, such as metal, metalloid, non-metal and their oxides. For instance, the surface of silicon wafers used as components of semiconductor products is commonly subjected to a lapping step (rough polishing step) and a polishing step (fine polishing step) to have a high-quality mirror surface. The polishing step typically includes a preliminary polishing step and a final polishing step. Prior art documents relating to polishing compositions mainly used for polishing of a semiconductor substrate such as a silicon wafer include Patent Literatures 1 to 3. Patent Literature 4 relates to polishing liquid for CMP process.

CITATION LIST

Patent Literatures

PTL 1: JP 2005-268667 A
PTL 2: WO 2012/63757
PTL 3: JP 2014-041978 A
PTL 4: WO 2004/100242

SUMMARY OF INVENTION

Technical Problem

Recently a more improved polishing removal rate has been requested for semiconductor substrates such as a silicon wafer and other substrates in terms of the productivity or the like. For instance, the polishing removal rate may be improved at any polishing step (preliminary polishing step) upstream of the final polishing step in the polishing step, whereby productivity of the substrates can be improved. In the preliminary polishing step, a polishing composition may be used repeatedly (recycled-use) in recycle. Therefore a polishing composition capable of keeping a good polishing removal rate stably in such a usage mode as well, if any, will effectively contribute to the improvement of productivity.

In view of the circumstances, the present invention aims to provide a polishing composition capable of keeping a good polishing removal rate stably.

Solution to Problem

The present invention provides a polishing composition, including silica particles as abrasives and a basic compound as polishing removal accelerator. The silica particles have a density of silanol groups that is 1.5 to 6.0 pieces/nm². The polishing composition has an adsorption ratio parameter A that is 1.2 or less, the adsorption ratio parameter representing concentration dependency of an amount of adsorption of the basic compound to the silica particles as a ratio of high-concentration adsorption amount/low-concentration adsorption amount.

A smaller adsorption ratio parameter A means that the amount of a basic compound adsorbed to silica particles is less affected by the amount (concentration) of the basic compound included in the polishing composition. For instance, this means that even when the amount of a basic compound included in the polishing composition decreases, the amount of the basic compound to silica particles hardly decreases. Therefore a polishing composition having a small adsorption ratio parameter A is hardly lowered in polishing removal rate even when the concentration of the basic compound decreases during use. A polishing composition including silica particles having a density of silanol group within the above range and including a basic compound having a small value of the adsorption ratio parameter A about the silica particles can keep a good polishing removal rate stably.

A polishing composition according to one preferable embodiment includes, as polishing removal accelerator, a basic compound having the adsorption ratio parameter A that is 1.1 or less. Such a polishing composition can exert a better effect of suppressing a decrease in polishing removal rate.

In a polishing composition according to another preferable embodiment, a density of silanol groups of the silica particles is 1.5 to 4.0 pieces/nm². A polishing composition including such silica particles as abrasives can exert a higher polishing removal rate stably.

The technique disclosed here can be preferably embodied in the embodiment in which the basic compound includes one type or two types or more of compounds selected from the group consisting of the following general formula (A) and general formula (B):

[Chemical Formula 1]

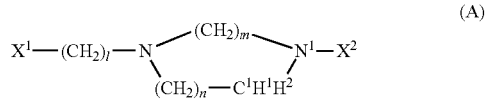

(A)

where $X^1$ denotes a hydrogen atom, an amino group, or a bond to $C^1$ atom, when $X^1$ denotes a bond to $C^1$ atom, $H^1$ atom is not present and $X^2$ denotes a hydrogen atom, an amino group, an aminoalkyl group or a bond to $C^1$ atom, when $X^2$ denotes a bond to $C^1$ atom, a $C^1$—$N^1$ bond is a double bond and $H^2$ atom is not present, I denotes an integer from 1 to 6, m denotes an integer from 1 to 4, and n denotes an integer from 0 to 4, and

[Chemical Formula 2]

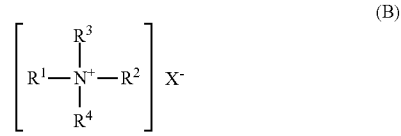

(B)

where $R^1$ to $R^4$ are selected independently from the group consisting of an alkyl group having the number of carbon atom of 8 or less, a hydroxyalkyl group having the number of carbon atom of 8 or less and an optionally substituted aryl group, and X– is an anion. A polishing composition including such a basic compound can exert a good polishing removal rate stably.

A polishing composition according to one preferable embodiment includes at least a compound represented by the above general formula (A) as the basic compound. A polishing composition having excellent ability of keeping a polishing removal rate can be configured favorably using the compound represented by the above general formula (A).

Preferable examples of a compound represented by the above general formula (A) include a compound (aminoalkylpiperazine) having at least one aminoalkyl group bonded to any one of nitrogen atoms in a piperazine cycle, such as N-(2-aminoethyl)piperazine and 1,4-bis(3-aminopropyl) piperazine.

In one preferable embodiment, the polishing composition is alkaline typically, and specifically has a pH of 8 to 12. This leads to better effect of keeping a good polishing removal rate.

In one preferable embodiment of the technique disclosed here, the polishing composition does not include oxidant substantially. When the polishing composition includes oxidant, when such a composition is supplied to an object to be polished, the surface of the object to be polished is oxidized to form an oxide film, which may degrade the polishing removal rate. The polishing composition that does not include oxidant substantially used can avoid such a decrease in polishing removal rate.

In one preferable embodiment of the technique disclosed here, the silica particles include colloidal silica. According to the technique disclosed here, polishing is performed using colloidal silica having a density of silanol groups within the above range, and a good polishing removal rate can be kept stably.

In one preferable embodiment of the technique disclosed here, the polishing composition as stated above is used for polishing of a silicon wafer (typically a silicon single-crystal wafer). The polishing composition disclosed here is preferably used for polishing of a silicon wafer subjected to lapping, for example. Of them, this is particularly preferably used for preliminary polishing of a silicon wafer.

DESCRIPTION OF EMBODIMENTS

A preferable embodiment of the present invention will now be described. Matters not specifically mentioned in the description but required for embodying the present invention can be understood as matters of design variation of a person skilled in the art based on related art in the field. The present invention can be embodied on the basis of the contents disclosed in the description and common general knowledge in the field.

<Abrasives>

A polishing composition disclosed here includes silica particles as abrasives. For instance, when the technique disclosed here is used for a polishing composition that can be used for polishing of a silicon wafer, such a polishing composition includes silica particles as abrasives particularly preferably. The reason is as follows. That is, when an object to be polished is a silicon wafer, since silica particles as abrasives used include the same elements as those of the object to be polished and oxygen atoms, residues such as metal or metalloid that are different from silicon will not be generated after polishing. Therefore this can avoid the deterioration of electrical properties of silicon wafer, resulting from contamination at the surface of the silicon wafer or diffusion of metal or metalloid that is different from silicon into the object to be polished. Further since silicon and silica have similar degree of hardness, excessive damage will not be given to the surface of silicon wafers during polishing. From such a viewpoint, a polishing composition including silica particles only as abrasives is exemplified as one form of the preferable polishing composition. In addition, silica has such characteristics that highly pure silica is easily available. This is another reason why silica particles are preferable as the abrasives.

As the silica particles, those having a density of silanol group of 1.5 to 6.0 pieces/$nm^2$ are preferably used. This is described below. In the CMP method using abrasives and polishing removal accelerator, the abrasives contribute to the polishing of an object to be polished mainly from its mechanical action, while the polishing removal accelerator contributes to the polishing of an object to be polished mainly from its chemical action. It can be considered that, rather than that the abrasives and the polishing removal accelerator exert their polishing abilities independently, their mechanical action and chemical action are mutually related to achieve effective polishing. In such a CMP method, the present inventors focused on the position of polishing removal accelerator relative to abrasives in polishing liquid (relative relationship in arrangement). Specifically a basic compound used as polishing removal accelerator can have adsorptive property to the surface of silica particles as abrasives in the polishing liquid. It can be considered that such polishing removal accelerator adsorbed or adjacent to the surface of abrasives follow the abrasives and can reach the surface of an object to be polished more effectively. Various studies on abrasives based on this finding revealed that abrasives having a density of silanol group within a predetermined range can lead to good exertion of both of the chemical action by polishing removal accelerator and the mechanical polishing action by abrasives to realize effective polishing.

A "density of silanol group" here refers to the number of silanol groups per the surface area of silica particles of 1 $nm^2$, which can be calculated from the specific surface area of silica particles measured by a BET method, BET specific surface area, and the amount of silanol groups measured by titration. Specifically, a density of silanol groups can be measured in accordance with a method for measuring a density of silanol groups described in the below-described examples. As silica particles in the technique disclosed here, commercially available silica particles having a desired density of silanol groups can be used, or silica particles having a desired density of silanol groups can be synthesized by a well-known technique.

As a density of silanol groups of silica particles increases, the amount of a basic compound adsorbed to the silica particles typically increases. Silica particles with more basic compound as polishing removal accelerator adsorbed thereto can be brought to the surface of the object to be polished together with the basic compound, whereby such silica particles can exert good polishing action. From such a viewpoint, a density of silanol groups of silica particles is preferably 1.5 pieces/$nm^2$ or more, more preferably 1.8 pieces/$nm^2$ or more and further preferably 2.0 pieces/$nm^2$ or more. When a too large density of silanol groups may lead to deterioration of polishing action of such silica particles. Such a too large density of silanol groups may lead to easy deterioration of the ability of keeping the polishing removal rate. Therefore appropriate density of silanol groups is 6.0 pieces/$nm^2$ or less, preferably 4.0 pieces/$nm^2$ or less, more preferably 3.0 pieces/$nm^2$ or less, and further preferably 2.5 pieces/$nm^2$ or less.

Specific examples of silica particles include colloidal silica, fumed silica, and precipitated silica. From the viewpoint that scratches are unlikely to be generated on the surface of an object to be polished and a surface having a lower haze can be achieved, preferred examples of the silica particles include colloidal silica and fumed silica. Of them, colloidal silica is preferred. For instance, colloidal silica can be preferably adopted as the abrasives in a polishing composition used for polishing (at least one of preliminary polishing and final polishing, preferably preliminary polishing) of silicon wafers.

The shape of silica particles disclosed here is not limited especially, and the silica particles may have a spherical form or a non-spherical form. Specific examples of the shape of non-spherical silica particles include a peanut-like shape (or a peanut shell-like shape), a cocoon-like shape, and a shape with protrusions. One type of silica particles having the same shape may be used alone, or two types or more of silica particles having different shapes may be combined for use. For example, silica particles in which many of the particles have a peanut-like shape can be preferably adopted.

Silica making up silica particles typically has a density of 1.5 or more. The density is usually 1.6 or more appropriately, preferably 1.7 or more, more preferably 1.8 or more, further preferably 1.9 or more, and particularly preferably 2.0 or more. An increase in density of silica can lead to the improvement in polishing removal rate when polishing an object to be polished (e.g., a silicon wafer). From the viewpoint of reducing scratches generated on the surface (polished face) of an object to be polished, silica particles having such a density of 2.3 or less, e.g., silica particles having a density of 2.2 or less, are preferable. As the density of abrasives (typically silica), a measurement determined by a liquid displacement method using ethanol as the displacement liquid can be adopted.

A polishing composition disclosed here may include abrasives other than silica particles within the range of not greatly degrading the advantageous effect of the present invention. Such abrasives other than silica particles (hereinafter they may be called "optional abrasives") may be inorganic particles other than silica, organic particles, or organic/inorganic composite particles. Specific examples of the inorganic particles include oxide particles such as alumina particles, cerium oxide particles, chromium oxide particles, titanium dioxide particles, zirconium oxide particles, magnesium oxide particles, manganese dioxide particles, zinc oxide particles, and colcothar particles; nitride particles such as silicon nitride particles and boron nitride particles; carbide particles such as silicon carbide particles and boron carbide particles; diamond particles; and carbonates such as calcium carbonate and barium carbonate. Specific examples of the organic particles include polymethyl methacrylate (PMMA) particles, poly(meth)acrylic acid particles (here, the (meth)acrylic acid inclusively means acrylic acid and methacrylic acid), and polyacrylonitrile particles. Such optional abrasive types may be used singly or in combination of two or more of them.

The content of optional abrasives is appropriately 30% by weight or less, for example, of the total weight of abrasives included in the polishing composition, preferably 20% by weight or less, and more preferably 10% by weight or less. The technique disclosed here is preferably embodied when the content of optional abrasives is 5% by weight or less of the total weight of abrasives included in the polishing composition. The polishing composition may not include optional abrasives substantially. The polishing composition not including optional abrasives substantially means that no optional abrasives are blended at least intentionally.

In the technique disclosed here, the abrasives included in the polishing composition may be in the form of primary particles or in the form of secondary particles formed by assembly of a plurality of primary particles. Abrasives in the form of primary particles may be mixed with abrasives in the form of secondary particles. In a preferred embodiment, at least some of the abrasives are contained in the form of secondary particles in the polishing composition.

The average primary particle size of the abrasives is not limited especially, but is preferably 5 nm or more, more preferably 10 nm or more, and particularly preferably 20 nm or more from the viewpoint of polishing removal rate, for example. From the viewpoint of achieving higher polishing effect, the average primary particle size is preferably 25 nm or more and more preferably 30 nm or more. Abrasives having the average primary particle size of 40 nm or more may be used. From the viewpoint of the storage stability (e.g., the dispersion stability), the average primary particle size of the abrasives is preferably 100 nm or less, more preferably 80 nm or less, further preferably 70 nm or less, and 60 nm or less, for example. In the technique disclosed here, the average primary particle size of abrasives can be, for example, calculated in accordance with the equation of $D=2727/S$ (nm) using the specific surface area ($m^2/g$) measured by the BET method. The specific surface area can be measured by using a surface area analyzer, trade name "Flow Sorb II 2300" manufactured by Micromeritics, for example.

The average secondary particle size (secondary particle size) of abrasives is not limited especially, but is preferably 10 nm or more, more preferably 15 nm or more, further preferably 20 nm or more, and particularly preferably nm or more. From the viewpoint of achieving higher polishing effect, the average secondary particle size is particularly preferably 40 nm or more (e.g., 50 nm or more, typically 60 nm or more). From the viewpoint of the storage stability (e.g., the dispersion stability), the average secondary particle size of the abrasives is appropriately 200 nm or less, preferably 150 nm or less, and more preferably 100 nm or less (e.g., 80 nm or less). The average secondary particle size of abrasives can be, for example, measured by dynamic light scattering using model "UPA-UT151" manufactured by NIKKISO CO., LTD., for example. The same applies to other embodiments.

The average ratio of major axis length/minor axis length (average aspect ratio) of the abrasives is not limited especially, but it is preferably 1.01 or more and more preferably 1.05 or more (e.g., 1.1 or more). An increase in average aspect ratio of the abrasives leads to a higher polishing removal rate. The average aspect ratio of the abrasives is preferably 3.0 or less, more preferably 2.0 or less, and further preferably 1.5 or less from the viewpoint of the polishing removal rate and less scratches.

The shape (outer shape) and the average aspect ratio of the abrasives can be understood by observation under an electron microscope, for example. Specific procedures for understanding the average aspect ratio are as follows. For example, a predetermined number (for example, 200 pieces) of abrasives that can be identified to have independent particle shapes are observed under a scanning electron microscope (SEM), and a rectangle is circumscribed around each grain image so as to have a minimum area. The long side length (major axis length) of the rectangle circumscribing each grain image is divided by the short side length (minor axis length), and the calculated value is considered as the major axis length/minor axis length ratio (aspect ratio). The arithmetic mean of the aspect ratios of the predetermined number of grains is calculated to give the average aspect ratio.

<Polishing Removal Accelerator>

A polishing composition disclosed here includes a basic compound as a polishing removal accelerator in addition to silica particles having a density of silanol groups as stated above. A polishing removal accelerator functions to polish an object to be polished chemically, and is a component that contributes to the improvement in polishing removal rate. A basic compound used as the polishing removal accelerator can increase pH of the polishing composition, and can improve the dispersion state of the abrasives. This can improve the dispersion stability of the polishing composition, and can improve the mechanical polishing action of the abrasives. The basic compound may be an organic basic compound such as cyclic amines or quaternary ammonium compounds or an inorganic basic compound. For the basic compound, those listed below may be used singly or in combination of two types or more of them.

For the polishing removal accelerator in the technique disclosed here, a basic compound having an adsorption ratio parameter A of 1.2 or less is preferably used, and the adsorption ratio parameter represents the density dependency of the amount of adsorption to silica particles. This is described below. A smaller adsorption ratio parameter A (closer to 1) means that the amount of a basic compound adsorbed to silica particles included in a polishing composition is less affected by the amount (concentration) of the basic compound included in the polishing composition. For instance, even when the basic compound in the polishing composition is consumed by reaction with an object to be polished, for example, during the use of the polishing composition, the amount of the basic compound adsorbed to silica particles hardly decreases. Therefore a polishing composition having a small adsorption ratio parameter A is hardly lowered in polishing removal rate even when the concentration of the basic compound decreases during use. Suppression of lowering in polishing removal rate during the use of the polishing composition can lead to improvement of the polishing efficiency in the polishing step as a whole, and to improvement in productivity. A polishing composition with less lowering in performance (e.g., lowering in polishing removal rate) during the use in recycle is preferable also from the viewpoint of reducing environmental load or material cost because of the reduced amount of waste liquid.

This "adsorption ratio parameter A" is determined as follows: two types of dispersion liquid ($a_2$) and ($b_2$) are prepared, one of which includes 10% by weight of silica particles of the same type as that included in the polishing composition and 0.1 mol/L of the basic compound of the same type as that included in the polishing composition, the other of which includes 10% by weight of the silica particles and 0.2 mol/L of the basic compound. Then each dispersion liquid is diluted with water by a factor of 15, and the amounts of adsorption of the basic compound to the silica particles, low-concentration adsorption amount ($a_A$) and high-concentration adsorption amount ($b_A$), are found. Then, the "adsorption ratio parameter A" is calculated by the following expression using these adsorption amounts: $A = b_A/a_A$.

The adsorption amounts ($a_A$) and ($b_A$) of the basic compound to the silica particles can be found by subtracting the amount of the basic compound in the water phase of the dispersion liquid, free basic compound, from the overall amount of the basic compound included in each of the two types of dispersion liquid. The amount of the basic compound in the water phase can be measured by a well-known appropriate method using total organic carbon (TOC), titration, or the like. A sample for measurement can be prepared by performing pretreatment such as concentration tuning or pH tuning, as needed, to supernatant liquid obtained from the dispersion liquid through centrifugal separation. From the viewpoint of measurement accuracy, dispersion liquid as aqueous solution ($a_1$) and ($b_1$) prepared similarly to the dispersion liquid ($a_2$) and ($b_2$) other than that they does not include silica particles is preferably used as reference as in the method for measurement of the adsorption ratio parameter A described in the below-described examples.

Specifically, the adsorption ratio parameter A can be measured in accordance with a method for measuring the adsorption ratio parameter A described in the below-described examples. In this method for measuring the adsorption ratio parameter A, the amount of the basic compound in the water phase is found by a method based on TOC measurement.

As stated above, the adsorption ratio parameter A is calculated as the ratio of high-concentration adsorption amount ($b_A$) to the low-concentration adsorption amount ($a_A$). Typically as the concentration of a basic compound increases, the amount of silica particles adsorbed to the basic compound tends to increase. Therefore, the adsorption ratio parameter A is, but not limited especially, about 0.95 or more usually, and 1.00 or more typically.

The adsorption ratio parameter A is preferably 1.20 or less. From the viewpoint of the ability of keeping a better polishing removal rate, the adsorption ratio parameter is more preferably 1.10 or less, and further preferably 1.05 or less. In one preferable embodiment, a basic compound having the adsorption ratio parameter A in the range of 0.95 to 1.05 (e.g., 1.00 to 1.02) is used.

In the basic compound satisfying the above-stated adsorption ratio parameter A, the absolute values of the low-concentration adsorption amount ($a_A$) and of the high-concentration adsorption amount ($b_A$) are not limited especially. In one preferable embodiment, the low-concentration adsorption amount ($a_A$) may be 0.1 to 5.0 mol/L, more preferably 0.5 to 2.0 µmol/L. In another preferable embodiment, the high-concentration adsorption amount ($b_A$) may be 0.1 to 6.0 µmol/L, more preferably 0.5 to 2.4 µmol/L. A polishing composition including a basic compound satisfying one or both of the above adsorption amounts ($a_A$) and ($b_A$) can exert the effect obtained from the configuration disclosed herein favorably.

The polishing composition disclosed here may include a basic compound satisfying the adsorption ratio parameter A as stated above that may be of one type of them singly or of two types or more in combination of them. The polishing composition disclosed here may further include a basic compound not satisfying the adsorption ratio parameter A as stated above (e.g., a basic compound having the adsorption ratio parameter A exceeding 1.2) in addition to a basic compound satisfying the adsorption ratio parameter A as stated above. In this case, the ratio in weight of a basic compound satisfying the adsorption ratio parameter A as stated above in the total weight of the basic compound included in the polishing composition preferably exceeds 50% by weight, more preferably 70% by weight or more, and further preferably 85% by weight or more (e.g., 95% by weight or more). In one preferable embodiment, a basic compound included in the polishing composition is substantially made up of a basic compound satisfying the adsorption ratio parameter A as stated above. In another preferable embodiment, the polishing composition includes at least an organic basic compound, and the organic basic compound is substantially made up of an organic basic compound satisfying the adsorption ratio parameter A as stated above.

A polishing composition according to one preferable embodiment includes, as a basic compound, at least one type of compound selected from the group consisting of compound (A) represented by the following general formula (A) and compound (B) represented by the following general formula (B). Such a compound used as a polishing removal accelerator leads to the tendency of greatly improving the ability of keeping the polishing removal rate. This is especially significant in the embodiment of polishing while using a polishing composition in recycle, for example. A compound selected from the group consisting of compound (A) and compound (B) may be used singly in type or in combination of two types or more of them.

[Chemical Formula 3]

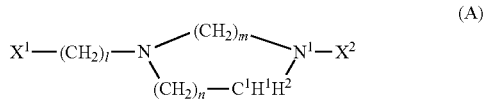

(A)

where $X^1$ in general formula (A) denotes a hydrogen atom, an amino group or a bond to $C^1$ atom. When $X^1$ denotes a bond to $C^1$ atom, $H^1$ atom is not present. The above $X^1$ preferably denotes an amino group or a bond to $C^1$ atom, more preferably an amino group. $X^2$ denotes a hydrogen atom, an amino group, an aminoalkyl group or a bond to $C^1$ atom. When $X^2$ denotes a bond to $C^1$ atom, a $C^1$—$N^1$ bond is a double bond and $H^2$ atom is not present. The above $X^2$ preferably denotes a hydrogen atom or an aminoalkyl group having the number of carbon atom of 1 to 4 (typically 2 or 3), more preferably a hydrogen atom. l denotes an integer from 0 to 6 (preferably 1 to 6, more preferably 2, 3, or 4), m denotes an integer from 1 to 4 (preferably 2 or 3), and n denotes an integer from 0 to 4 (preferably 0 or 1).

[Chemical Formula 4]

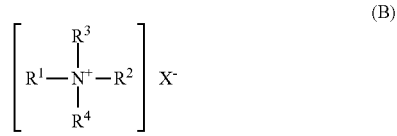

(B)

where $R^1$ to $R^4$ in general formula (B) are selected independently from the group consisting of an alkyl group having the number of carbon atoms of 8 or less, a hydroxyalkyl group having the number of carbon atoms of 8 or less and an optionally substituted aryl group. X– denotes an anion.

An example of compound (A) includes a cyclic amine compound, in which both of $X^1$ and $X^2$ in general formula (A) as stated above is a hydrogen atom. In this case, l in general formula (A) may be 0 or 1 to 6. m denotes 1 to 4, preferably 2 to 4. n denotes 0 to 4, preferably 1 to 4. A specific example of such cyclic amines includes piperazine, N-methylpiperazine, N-ethylpiperazine, and N-butylpiperazine. A preferable example may be cyclic amine, in which $X^2$ in general formula (A) denotes a hydrogen atom and $X^1$ denotes an amino group. In this case, l in general formula (A) may be 0 to 6, preferably 2 to 6. m denotes 1 to 4, preferably 2 to 4. n denotes 0 to 4, preferably 1 to 4. A specific example of such cyclic amine includes N-aminomethylpiperazine, N-(2-aminoethyl)piperazine, and N-(3-aminopropyl)piperazine.

Cyclic amine, in which $X^1$ in general formula (A) denotes an amino group and $X^2$ denotes an aminoalkyl group, also is preferably used. A specific example of such cyclic amine includes 1,4-bis(2-aminoethyl)piperazine, and 1,4-bis (3-aminopropyl)piperazine.

Another preferable example of compound (A) includes a cyclic diamine compound in which both of $X^1$ and $X^2$ in general formula (A) as stated above denotes a bond to $C^1$ atom. In this case, l in general formula (A) may be 0 to 6, preferably 3 to 6. m denotes 1 to 4, preferably 2 or 3. n denotes 0 to 4, preferably 0 to 2. Specific examples of such a cyclic diamine compound includes 1,8-diazabicyclo[5.4.0]undeca-7-ene and 1,5-diazabicyclo[4.3.0]-5-nonene.

A polishing composition according to one preferable embodiment may include at least one type of compound (A) satisfying the adsorption ratio parameter (A) as stated above. Preferable examples of such compound (A) include aminoalkylpiperazines such as N-aminoalkylpiperazine, in which any one of two nitrogen atoms of a piperazine cycle has one aminoalkyl group, including N-aminomethylpiperazine, N-(2-aminoethyl)piperazine, or N-(3-aminopropyl)piperazine; and 1,4-bis (aminoalkyl)piperazine, in which two nitrogen atoms of a piperazine cycle each have one aminoalkyl group, including 1,4-bis(2-aminoethyl)piperazine, and 1,4-bis(3-aminopropyl)piperazine. Of them, preferable basic compounds include N-(2-aminoethyl)piperazine, N-(3-aminopropyl)piperazine and 1,4-bis(3-aminopropyl)piperazine. N-(2-aminoethyl)piperazine is particularly preferable.

Types of anions (X–) in compound B are not limited especially, which may be organic anions or inorganic anions. For instance, they include halide ions (e.g., F—, Cl—, Br—, I—), hydroxide ions (OH—), tetrahydroborate ions ($BH_4$—), nitrate ions, nitrite ions, chlorate ions, chlorite ions, hypochlorite ions, perchlorate acid ions ($ClO_4$—), sulfate ions, hydrogensulfate ions, sulfite ions, thiosulfate ions, carbonate ions, phosphate ions, dihydrogen phosphate ions, hydrogen phosphate ions, sulphamic acid ions, carboxylate ions (e.g., formic acid ions, acetate ions, propionate ions, benzonate ions, glycine acid ions, butyrate ions, citrate ions, tartrate ions, and trifluoroacetic acid ions), acetate ions, organic sulfonate ions (e.g., methanesulfonate ions, trifluoromethanesulfonate ions, benzenesulfonate ions, and toluenesulfonate ions), organic phosphonate ions (methylphosphonate ions, benzenphosphonate ions, and toluenephosphonate ions), and organic phosphate ions (e.g., ethylphosphate ions). Preferable anions include OH—, F—, Cl—, Br—, I—, $ClO_4$—, and $BH_4$—. Of them, hydroxide ions (OH—) are preferred.

In compound (B), substituent groups $R^1$, $R^2$, $R^3$ and $R^4$ on the nitrogen atom may be selected independently from the group consisting of an alkyl group having the number of carbon atoms of 1 to 8, a hydroxyalkyl group having the number of carbon atoms of 1 to 8 and an aryl group. $R^1$, $R^2$, $R^3$, and $R^4$ may be the same or different.

Examples of the alkyl group having the number of carbon atoms of 1 to 8 include methyl groups, ethyl groups, propyl groups, butyl groups, pentyl groups, hexyl groups, heptyl groups and octyl groups. The number of carbon atoms of the alkyl groups is preferably 2 to 6, more preferably 3 to 5. The alkyl groups may be of a linear shape or a branched shape.

Examples of the hydroxyalkyl group having the number of carbon atoms of 1 to 8 include hydroxymethyl groups, hydroxyethyl groups, hydroxypropyl groups, hydroxybutyl groups, hydroxypentyl groups, hydroxyhexyl groups, hydroxyheptyl groups and hydroxyoctyl groups. The number of carbon atoms of the hydroxyalkyl groups is preferably 2 to 6, more preferably 3 to 5. The hydroxyalkyl groups may be of a linear shape or a branched shape.

The aryl group in general formula (B) may include an aryl group without a substituent group (e.g., a phenyl group) and an aryl group in which one or a plurality of hydrogen atoms is substituted with a substituent group (e.g., an alkyl group having the number of carbon atoms of 1 to 4, a hydroxyalkyl group having the number of carbon atoms of 1 to 4, and a hydroxy group). Such an optionally substituted aryl group includes a phenyl group, a benzyl group, a naphthyl group, or a naphthylmethyl group.

A buthyl group herein is a concept that covers its various types of constitutional isomers (n-butyl groups, isobutyl groups, sec-butyl groups and tert-butyl groups). The same applies to other functional groups.

One preferable example of compound (B) includes ammonium salt, in which all of $R^1$, $R^2$, $R^3$ and $R^4$ are alkyl groups having the number of carbon atoms of 3 or more (e.g., 3 to 6). Ammonium salt here refers to salt of quaternary ammonium cations and anions (X−) and is a concept that covers hydroxide. The same applies to other compounds (B). Examples of such compound (B) include tetraalkylammonium salts (e.g., hydroxide such as tetraalkylammonium hydroxide), including tetrapropylammonium salt, tetrabutylammonium salt, tetrapentylammonium salt, and tetrahexylammonium salt. Of them, tetrabutylammonium salts such as tetrabutylammonium hydroxide are preferred. Another example includes compound (B) having an asymmetric structure, such as hexyltripropylammonimum salt. An asymmetric structure here means that two types or more of different substituent groups (that may include a constitutional isomer) are bonded to a nitrogen atom. In preferable compound (B), all of $R^1$, $R^2$, $R^3$ and $R^4$ are linear alkyl groups.

Another example of compound (B) includes a compound, in which all of $R^1$, $R^2$, $R^3$ and $R^4$ are hydroxyalkyl groups having the number of carbon atoms of 2 or more (e.g., 2 to 4). Examples of such compound (B) include tetrahydroxyalkylammonium salts (e.g., hydroxide), including tetrahydroxyethylammonium salt, tetrahydroxypropylammonium salt, and tetrahydroxybutylammonium salt.

In another compound (B), all of $R^1$, $R^2$, $R^3$ and $R^4$ may be aryl groups. Examples of such compound (B) include tetraphenylammonium salts and tetrabenzilammonium salts.

Another example of compound (B) includes a compound, in which one, two or three of $R^1$, $R^2$, $R^3$ and $R^4$ are hydroxyalkyl groups, and the remaining is an alkyl group. Specific examples include hydroxymethyl trimethylammonium salt, hydroxyethyl trimethylammonium salt, hydroxypropyl trimethylammonium salt, hydroxybutyl trimethylammonium salt, and dihydroxyethyl dimethylammonimum salt.

Another example of compound (B) includes a compound, in which one, two or three of $R^1$, $R^2$, $R^3$ and $R^4$ are alkyl groups, and the remaining is an aryl group. Examples of such compound (B) include trimethylphenylammonium salt, triethylphenylammonium salt, benziltrimethylammonium salt, methyltriphenylammonimum salt, and tribenzilmethylammonium salt.

Another example of compound (B) includes a compound, in which one, two or three of $R^1$, $R^2$, $R^3$ and $R^4$ are hydroxyalkyl groups, and the remaining is an aryl group. Examples of such compound (B) include hydroxymethyltriphenylammonium salt and tribenzilhydroxymethylammonium salt.

A polishing composition according to one preferable embodiment may include at least one type of compound (B) satisfying the adsorption ratio parameter (A) as stated above. Preferable specific examples of such compound (B) include tetraalkylammonium salts (e.g., hydroxide such as tetraalkylammonium hydroxide), including tetrapropylammonium salt, tetrabutylammonium salt, tetrapentylammonium salt, and tetrahexylammonium salt. Of them, tetrabutylammonium hydroxide is preferred.

The polishing composition disclosed here may include the combination of compound (A) of one type or two types or more satisfying the adsorption ratio parameter A as stated above and compound (B) of one type or two types or more satisfying the adsorption ratio parameter A as stated above.

The polishing composition disclosed here may include one type or two types or more of basic compounds other than compounds (A) and (B). Such a basic compound may be an organic basic compound or an inorganic basic compound that do not correspond to any one of compounds (A) and (B). They may or may not satisfy the adsorption ratio parameter A as stated above.

One example of an organic basic compound that does not correspond to compound (A) and (B) includes quaternary phosphonium salts, such as tetraalkylphosphonium salt. Anions in the phosphonium salt as stated above may be OH—, F—, Cl—, Br—, I—, $ClO_4$—, or $BH_4$—. For instance, hallides and hydroxides such as tetramethylphosphonium, tetraethylphosphonium, tetrapropylphosphonium, and tetrabutylphosphonium, may be used.

Other examples of the organic basic compound as stated above include amines such as methylamine, dimethylamine, trimethylamine, ethylamine, diethylamine, triethylamine, ethylenediamine, monoethanolamine, N-(β-aminoethyl)ethanolamine, hexamethylendiamine, diethylenetriamine, and triethylenetetramine; aminopyridines such as 2-aminopyridine, 3-aminopyridine, 4-aminopyridine, 2-(methylamino)pyridine, 3-(methylamino)pyridine, 4-(methylamino)pyridine, 2-(dimethylamino)pyridine, 3-(dimethylamino)pyridine, and 4-(dimethylamino)pyridine; azoles such as imidazole and triazole; guanidine; diazabicycloalkanes such as 1,4-diazabicyclo[2.2.2]octane.

One example of the inorganic basic compound includes ammonia. Another example of the inorganic basic compound includes hydroxide, carbonate, and hydrogen carbonate of ammonia; hydroxide, carbonate, and hydrogen carbonate of alkali metals; and hydroxide, carbonate, and hydrogen carbonate of alkali earth metals. Specific examples of the hydroxide include potassium hydroxide and sodium hydroxide. Specific examples of the carbonate or hydrogen carbonate include ammonium hydrogen carbonate, ammonium carbonate, potassium hydrogen carbonate, potassium carbonate, sodium hydrogen carbonate and sodium carbonate.

In one preferable embodiment, 50% by weight or more, preferably 70% by weight or more, and more preferably 85% by weight or more (e.g., 95% by weight or more) of the basic compound included in the polishing composition is an organic basic compound. A basic compound included in the polishing composition is substantially made up of an organic basic compound. In other words, a polishing composition disclosed here has a composition that does not include an inorganic basic compound substantially.

The amount of the polishing removal accelerator included in the polishing composition may be 50 g to 1000 g, for example, per abrasives of 1 kg. From the view point of the polishing removal rate, the amount of the polishing removal accelerator is preferably 100 g or more (e.g., 200 g or more, typically 250 g or more) per polishing composition of 1 kg. Since too much polishing removal accelerator may lead to deterioration in the quality at the surface, the amount of the polishing removal accelerator per abrasives of 1 kg typically is 800 g or less appropriately, preferably 700 g or less, and for example less than 500 g (typically less than 400 g).

<Water>

As water making up the polishing composition disclosed here, ion-exchanged water (deionized water), pure water, ultrapure water, and distilled water can be preferably used. In the water used, the total content of transition metal ions is preferably 100 ppb or less, for example, in order to avoid the inhibition of functions of other components contained in the polishing composition as much as possible. For example, the water purity can be increased by an ion exchange resin to remove impurity ions, by a filter to remove foreign substances, distillation, or similar operations.

The polishing composition disclosed here may further contain an organic solvent homogeneously miscible with water (such as lower alcohols and lower ketones), as needed. Commonly, 90% by volume or more of the solvent contained in the polishing composition is preferably water, and 95% by volume or more (typically, 99 to 100% by volume) of the solvent is more preferably water.

<Chelating Agent>

A polishing composition disclosed here may include chelating agent as an optional component. Chelating agent forms complex ions with metal impurities that may be included in the polishing composition and capture the metal impurities, thereby suppressing contamination of the object to be polished by the metal impurities. Chelating agent types may be used singly or in combination of two or more of them.

Examples of the chelating agent include aminocarboxylic acid chelating agents and organic phosphonic acid chelating agents. Examples of the aminocarboxylic acid chelating agent include ethylenediaminetetraacetic acid, sodium ethylenediaminetetraacetate, nitrilotriacetic acid, sodium nitrilotriacetate, ammonium nitrilotriacetate, hydroxyethylethylenediaminetriacetic acid, sodium hydroxyethylethylenediaminetriacetate, diethylenetriaminepentaacetic acid, sodium diethylenetriaminepentaacetate, triethylenetetraminehexaacetic acid, and sodium triethylenetetraminehexaacetate. Examples of the organic phosphonic acid chelating agent include 2-aminoethylphosphonic acid, 1-hydroxyethylidene-1,1-diphosphonic acid, aminotri(methylenephosphonic acid), ethylenediaminetetrakis(methylenephosphonic acid), diethylenetriaminepenta(methylenephosphonic acid), ethane-1,1-diphosphonic acid, ethane-1,1,2-triphosphonic acid, ethane-1-hydroxy-1,1-diphosphonic acid, ethane-1-hydroxy-1,1,2-triphosphonic acid, ethane-1,2-dicarboxy-1,2-diphosphonic acid, methanehydroxyphosphonic acid, 2-phosphonobutane-1,2-dicarboxylic acid, 1-phosphonobutane-2,3,4-tricarboxylic acid, and α-methylphosphonosuccinic acid. Of them, organic phosphonic acid chelating agents are more preferred, and aminotri(methylenephosphonic acid), ethylenediaminetetrakis(methylenephosphonic acid) and diethylenetriaminepenta(methylenephosphonic acid) are even more preferred.

The content of the chelating agent, but not limited especially, may be 0.000005 mol or more per the polishing composition of 1 liter (L). From the viewpoint of suppressing contamination by metal impurities, the content of the chelating agent is preferably 0.00001 mol/L or more, more preferably 0.00003 mol/L or more, and further preferably 0.00005 mol/L or more. Although the upper limit of the content of the chelating agent per polishing composition of 1 L is not limited especially, appropriate content of the chelating agent per polishing composition of 1 L is 0.005 mol/L or less, preferably 0.002 mol/L or less, and more preferably 0.001 mol/L or less.

The content of the chelating agent can be 0.1 g or more per abrasives of 1 kg, for example, preferably 0.5 g or more, more preferably 1 g or more, and further preferably 2 g or more. Appropriate content of the chelating agent per abrasives of 1 kg is 50 g or less, for example, preferably 30 g or less, more preferably 10 g or less.

Other Components>

The polishing composition disclosed here can further contain known additives usable in polishing compositions (typically, polishing compositions used for the polishing step of silicon wafers), such as water-soluble polymer, surfactant, an organic acid, an organic acid salt, an inorganic acid, an inorganic acid salt, an antiseptic agent, and a fungicide, as needed, to such an extent as not to markedly suppress effects of the invention.

Examples of the water-soluble polymer include cellulose derivatives, starch derivatives, polymer including oxyalkylene units, polymer including nitrogen atoms, and vinyl alcohol polymer. Specific examples include hydroxyethyl cellulose, pullulan, random copolymer or block copolymer of ethylene oxide and propylene oxide, polyvinyl alcohol, polyisoprenesulfonate, polyvinylsulfonate, polyallylsulfonate, polyisoamylenesulfonate, polystyrenesulfonate, polyacrylate, polyvinyl acetate, polyethylene glycol, polyvinylpyrrolidone, polyacryloylmorpholine, and polyacrylamide. The water-soluble polymer types may be used singly or in combination of two or more of them. The polishing composition disclosed here can be preferably embodied in an embodiment that does not include water-soluble polymer substantially.

The polishing composition disclosed here may include surfactant (typically water-soluble organic compound having the molecular weight less than $1\times10^4$) as an optional component. Such surfactant used can improve the dispersion stability of the polishing composition. Surfactant types may be used singly or in combination of two or more of them.

As the surfactant, an anionic surfactant or a nonionic surfactant can be preferably adopted. From the viewpoint of low foaming properties and easy adjustment of pH, a nonionic surfactant is preferred. Examples of nonionic surfactants include oxyalkylene polymers such as polyethylene glycol, polypropylene glycol, and polytetramethylene glycol; polyoxyalkylene adducts such as polyoxyethylene alkyl ethers, polyoxyethylene alkylphenyl ethers, polyoxyethylene alkylamines, polyoxyethylene fatty acid esters, polyoxyethylene glyceryl ether fatty acid esters, and polyoxyethylene sorbitan fatty acid esters; and copolymers (diblock copolymers, triblock copolymers, random copolymers, alternating copolymers) of a plurality types of oxyalkylenes.

Appropriate content of the surfactant per abrasives of 1 kg is 5 g or less, preferably 2 g or less, more preferably 1 g or less. The polishing composition disclosed here can be preferably embodied in an embodiment that does not include surfactant substantially.

Examples of the organic acid include fatty acids such as formic acid, acetic acid, and propionic acid, 2-hydroxybutyric acid, citric acid, tartaric acid, malic acid, succinic acid, organic sulfonic acids, and organic phosphonic acids. Examples of the organic acid salt include alkali metal salts (including sodium salts and potassium salts) of organic acids and ammonium salts of organic acids. Examples of the inorganic acid include sulfuric acid, nitric acid, hydrochloric acid, and carbonic acid. Examples of the inorganic acid salt include alkali metal salts (including sodium salts and potassium salts) of inorganic acids and ammonium salts of inorganic acids. The organic acids and salts thereof and the inorganic acids and salts thereof can be used singly in type or in combination of two types or more of them.

Examples of the antiseptic agent and the fungicide include isothiazoline compounds, p-hydroxybenzoate esters, and phenoxyethanol.

The polishing composition disclosed here preferably does not include oxidant substantially. When the polishing composition includes oxidant, when such a composition is supplied to an object to be polished (e.g., silicon wafer), the surface of the object to be polished is oxidized to form an oxide film, which may degrade the polishing removal rate. Specific examples of the oxidant include hydrogen peroxide ($H_2O_2$), sodium persulfate, ammonium persulfate, and sodium dichloroisocyanurate. The polishing composition not including oxidant substantially means that no oxidant is blended at least intentionally. Therefore, when a polishing composition inevitably includes a small amount of oxidant (e.g., the mol concentration of oxidant in the polishing composition is 0.0005 mol/L or less, preferably 0.0001 mol/L or less, more preferably 0.00001 mol/L or less, and particularly preferably 0.000001 mol/L or less) resulting from the raw materials or manufacturing method, such a polishing composition is covered by the concept mentioned here of the polishing composition that does not include oxidant substantially.

<Polishing Liquid>

The polishing composition disclosed here typically is supplied to an object to be polished in the form of polishing liquid including the polishing composition for polishing of the object to be polished. The polishing liquid can be prepared by diluting any one of the polishing compositions disclosed here (typically diluted with water), for example. Alternatively, the polishing composition may be used as the polishing liquid without any treatment. In other words, the concept of the polishing composition in the technique disclosed here covers both of polishing liquid that is supplied to an object to be polished for polishing the target (working slurry) and concentrated liquid that is diluted and is used as polishing liquid (a stock solution of a polishing liquid). Other examples of the polishing liquid containing the polishing composition disclosed here include polishing liquid prepared by adjusting the pH of the composition.

The content of abrasives in the polishing liquid disclosed here is not limited especially, but the content is typically 0.05% by weight or more, preferably 0.1% by weight or more, and more preferably 0.3% by weight or more (e.g., 0.5% by weight or more). An increase in the content of abrasives leads to a higher polishing removal rate. From the viewpoint of the dispersion stability of the polishing composition, for example, appropriate content of abrasives is 10% by weight or less, preferably 7% by weight or less, more preferably 5% by weight or less, and further preferably 3% by weight or less. The technique disclosed here is preferably used for the polishing liquid having such content of 2% by weight or less, and 1% by weight or less as well, from which the effect of keeping a good polishing removal rate stably can be obtained.

The polishing liquid preferably has a pH of 8.0 or more (e.g., 8.5 or more), more preferably 9.0 or more, and further preferably 9.5 or more (e.g., 10.0 or more). A larger pH of the polishing liquid leads to an increase in polishing removal rate. The upper limit of the pH of the polishing liquid is not limited especially, but the upper limit is preferably 12.0 or less (e.g., 11.5 or less) and more preferably 11.0 or less. This enables better polishing of an object to be polished. Such a pH can be preferably used for the polishing liquid used for polishing of silicon wafers. The pH of the polishing liquid can be found as follows: a pH meter (for example, a glass electrode-type hydrogen ion concentration indicator (model: F-23) manufactured by Horiba, Ltd.) and standard buffer solutions (a phthalate pH buffer solution with a pH of 4.01 (25° C.), a neutral phosphate pH buffer solution with a pH of 6.86 (25° C.), and a carbonate pH buffer solution with a pH of 10.01 (25° C.)) are used to perform three-point calibration. Then a glass electrode is then immersed in polishing liquid, and after 2 minutes or longer, a stabilized value is measured.

<Concentrated Liquid>

The polishing composition disclosed here may be in a concentrated form (that is, the form of a concentrated liquid of the polishing liquid) before supplied to an object to be polished. The polishing composition in such a concentrated liquid form has advantages from the viewpoint of the convenience at the time of production, distribution, storage, and the like and cost reduction, for example. The concentration rate can be, for example, about 2 to 100 and usually is about 5 to 50 in terms of volume appropriately. The concentration rate of a polishing composition according to a preferred embodiment is 10 to 40.

The polishing composition in such a concentrated liquid form can be used in such a way that the polishing composition is diluted at an appropriate timing to give a polishing liquid, and the polishing liquid is supplied to an object to be polished. The dilution can be typically performed by adding the above-mentioned aqueous solvent to the concentrated liquid and mixing it. When the aqueous solvent is a mixed solvent, some of the components in the aqueous solvent may be added for dilution, or a mixed solvent containing these components at a ratio different from that of the aqueous solvent may be added for dilution. For a multi-pack type polishing composition as described later, some of the packed components may be diluted, and then the other packed components may be mixed to prepare polishing liquid. Alternatively, a plurality of packed components may be mixed, and then the mixture may be diluted to prepare polishing liquid.

The content of abrasives in such concentrated liquid may be 50% by weight or less, for example. From the viewpoint of stability of the polishing composition (for example, dispersion stability of abrasives), filterability and the like, the content of the abrasives in the concentrated liquid is commonly, preferably 45% by weight or less and more preferably 40% by weight or less. From the viewpoint of the convenience at the time of production, distribution, storage, and the like, cost reduction, and the like, the content of the abrasives in the concentrated liquid can be, for example, 0.5% by weight or more and is preferably 1% by weight or more and more preferably 3% by weight or more (for example, 4% by weight or more). In one preferable embodiment, the content of abrasives may be 5% by weight or more, or may be 10% by weight or more (e.g., 15% by weight or more, further 20% by weight or more, further 30% by weight or more).

The polishing composition disclosed here may be a one-pack type or a multi-pack type including a two-pack type. For example, the polishing composition can be composed in such a manner that liquid A containing some of the components of the polishing composition (typically a component other than the aqueous solvent) and liquid B containing the remaining components may be mixed, and the mixture is used for polishing an object to be polished.

<Preparation of Polishing Composition>

The method for manufacturing the polishing composition disclosed here is not limited especially. For example, a well-known mixer such as a blade-type stirrer, an ultrasonic disperser, and a homomixer may be used to mix components contained in the polishing composition. The manner of mixing these components is not limited to especially. For example, all of the components may be concurrently mixed, or the components may be mixed in an appropriate order.

<Applications>

The polishing composition disclosed here can be used for polishing of an object to be polished made of various materials and having various shapes. For instance, the object to be polished may be made of metals such as silicon, aluminum, nickel, tungsten, copper, tantalum, titanium, stainless-steel, and germanium, metalloids, or alloys of them; glass-based substances such as quartz glass, alminosilicate glass, and glasslike carbon; ceramic materials such as alumina, silica, sapphire, silicon nitride, tantalum nitride, and titanium nitride; composite semiconductor substrate materials such as silicon carbide, gallium nitride, and gallium arsenide; and resin materials such as polyimide resins. The object to be polished may be made of a plurality of materials of them. Of them, an object to be polished having a surface made of silicon (e.g., silicon materials such as silicon single-crystal wafer) is preferable for polishing. The technique disclosed here can be particularly preferably used for a polishing composition that includes silica particles only as abrasives and is used for polishing of silicon materials.

The object to be polished may have any shape. The polishing composition disclosed here can be preferably used for polishing of an object to be polished having, for example, a plate-like shape or a polyhedron shape with a flat surface or for polishing an edge of an object to be polished (for example, polishing a wafer edge).

<Polishing>

The polishing composition disclosed here is used for a polishing composition for polishing of silicon materials such as a silicon substrate (e.g., single-crystal or poly-crystal silicon wafer, especially silicon single-crystal wafer). The following describes one preferable embodiment of the method for polishing an object to be polished using the polishing composition disclosed here.

That is, polishing liquid including any one of the polishing compositions disclosed here is prepared. The preparing of polishing liquid can include preparing polishing liquid by subjecting a polishing composition to concentration adjustment (for example, dilution), pH adjustment, or other operations. Alternatively, the polishing composition may be used as the polishing liquid without any treatment. For a multi-pack type polishing composition, the preparing of polishing liquid can include mixing packed components, diluting one or a plurality of packed components before the mixing, and diluting the mixture after the mixing, for example.

Next, the polishing liquid is supplied to an object to be polished, and the target is polished in usual ways. For example, when a silicon substrate is subjected to primary polishing (typically, double-side polishing), a silicon substrate that has been subjected to a lapping step is set to a common polishing apparatus, and the polishing liquid is supplied to a surface to be polished of the silicon substrate through a polishing pad on the polishing apparatus. Typically, while the polishing liquid is continuously supplied, the polishing pad is pressed against the surface of the silicon substrate and the polishing pad and the silicon substrate are relatively moved (for example, rotationally moved). Subsequently, the silicon substrate is subjected to secondary polishing as needed (typically single-side polishing), and finally is subjected to final polishing, whereby polishing of the object to be polished ends.

The polishing composition disclosed here can be preferably used for polishing using a polishing pad. The polishing pad used in the polishing step may be any polishing pad. For example, any polishing pad of a nonwoven fabric type, a suede type, a polyurethane type, including abrasives, and not including abrasives can be used.

The polishing composition disclosed here can be used in the embodiment in which the polishing composition once used is discarded (so-called "one-way"), or may be repeatedly used in recycle. One example of the method for using the polishing composition in recycle includes collecting the polishing composition after use that is discharged from the polisher into a tank, and feeding the collected polishing composition to the polisher again. When the polishing composition is used in recycle, the amount of the polishing composition after use that is dealt with as wasted liquid can be reduced as compared with the case of one-way, and so environmental load can be reduced. Since the usage of the polishing composition is reduced, the cost can be reduced. The polishing composition disclosed here is less affected in amount of adsorption of the basic compound to abrasives by alkali concentration, and therefore a good polishing removal rate can be kept stably in such a usage form in recycle as well. Therefore, the importance of the configuration of the present invention can be exerted well in such a usage form.

When the polishing composition disclosed here is used in recycle, new components, components that are reduced during use or components that are desirably increased can be added to the polishing composition during use at any timing.

According to the description, a method for manufacturing a substrate is provided, which includes the step of polishing a substrate using the polishing composition disclosed here. The method for manufacturing a substrate disclosed here may further include a step of performing final polishing to the substrate subjected to the polishing using the polishing composition as stated above. The final polishing means the last polishing step in a production process of target products (in other words, the step after which no further polishing is performed). The final polishing may be performed using the polishing composition disclosed here or using another polishing composition.

In one preferable embodiment, the step of polishing the substrate using the polishing composition as stated above is a polishing step upstream of the final polishing. Of them, this step can be used preferably for preliminary polishing of the substrate subjected to lapping. For instance, the polishing composition disclosed here can be preferably used in the double-side polishing (typically primary polishing step using a double-side polisher) of a substrate subjected to lapping, or in the first single-side polishing of a substrate subjected to the double-side polishing (typically a first secondary polishing step). In these double-side polishing step and the first single-side polishing step, a larger polishing removal rate is required than in the final polishing. Therefore, the polishing composition disclosed here is preferable for the polishing composition used for polishing of a substrate in at least one of the double-side polishing and the first single-side polishing (preferably both of them). For instance, the polishing composition is preferable for the polishing composition used in the double-side polishing of a substrate subjected to lapping and in the embodiment of use in recycle. The method for manufacturing a substrate as stated above can be preferably performed in the embodiment including, after preliminary polishing of a substrate using the polishing composition disclosed here, final polishing of the substrate using another polishing composition.

Some examples relating to the present invention will next be described, but they are not intended to limit the present invention to these examples.

In the following examples, silanol group density and adsorption ratio parameter A were measured as follows.

<Method for Measuring Silanol Group Density>

The pH of dispersion liquid including 10% by weight of silica particles was adjusted into 3.0 to 3.5 using hydrochloric acid, and then the pH was adjusted to 4.0 using aqueous sodium hydroxide of 0.1 mol/L in concentration. This was used as a sample for titration. Such a sample for titration was titrated in the range of pH from 4.0 to 9.0 using aqueous sodium hydroxide of 0.1 mol/L in concentration, and silanol group density [pieces/nm$^2$] was calculated from the amount of titration at this time and the value of BET specific surface area of the silica particles as stated above. For the value of the BET specific surface area of the silica particles, the measurement obtained by a surface area analyzer, trade name "Flow Sorb II 2300" manufactured by Micromeritics, was used.

<Method for Measuring Adsorption Ratio Parameter A>

The following describes a method for measuring adsorption ratio parameter A by way of an example including N-(2-aminoethyl)piperazine (AEP) as the basic compound. The adsorption ratio parameter A was measured for other basic compounds used in Examples and Comparative Examples as well by a similar method.

(1) Measurement of Low-Concentration Adsorption Amount ($a_A$)

AEP aqueous solution ($a_0$) of 0.1 mol/L in concentration was prepared. This aqueous solution was diluted with water by a factor of 15, and total organic carbon (TOC) of such aqueous solution ($a_1$) was measured. Based on the measurement result, the AEP content ($C_{a1}$) [mol/L] of the aqueous solution ($a_1$) was found.

Dispersion liquid ($a_D$) including 10% by weight of silica particles and containing 0.1 mol/L of AEP was prepared. This dispersion liquid ($a_D$) was diluted with water by a factor of 15, and silica particles were centrifugally separated from such dispersion liquid ($a_2$) for sedimentation. Then, the supernatant liquid ($a_S$) was taken from there. TOC of this supernatant liquid ($a_S$) was measured, and based on the measurement result, the AEP content ($C_{aS}$) [mol/L] of the supernatant liquid ($a_S$) was found.

Based on these results, the adsorption amount ($a_A$) [mol/L] of AEP to silica particles at the low concentration was calculated by the following expression:

$$a_A = C_{a1} - C_{aS}.$$

(2) Measurement of High-Concentration Adsorption Amount ($b_A$)

AEP aqueous solution ($b_0$) of 0.2 mol/L in concentration was prepared. This aqueous solution was diluted with water by a factor of 15, and TOC of such aqueous solution ($b_1$) was measured. Based on the measurement result, the AEP content ($C_{b1}$) [mol/L] of the aqueous solution ($b_1$) was found. Dispersion liquid ($b_D$) including 10% by weight of silica particles and containing 0.2 mol/L of AEP was prepared. This dispersion liquid ($b_D$) was diluted with water by a factor of 15, and silica particles were centrifugally separated from such dispersion liquid ($b_2$) for sedimentation. Then, the supernatant liquid ($b_S$) was taken from there. TOC of this supernatant liquid ($b_S$) was measured, and based on the measurement result, the AEP content ($C_{bS}$) [mol/L] of the supernatant liquid ($b_S$) was found.

Based on these results, the adsorption amount ($b_A$) [mol/L] of AEP to silica particles at the high concentration was calculated by the following expression:

$$b_A = C_{b1} - C_{bS}.$$

(3) Calculation of Adsorption Ratio Parameter A

From the results of above (1) and (2), the adsorption ratio parameter A was found by the following expression:

$$A = b_A / a_A.$$

<Preparation of Polishing Composition>

Examples 1 to 7, Comparative Examples 1 to 2

Colloidal silica as silica particles (abrasives), N-(2-aminoethyl)piperazine (AEP) as the basic compound (polishing removal accelerator) and pure water were mixed to prepare the polishing compositions according to these examples. The content of the silica particles and the basic compound were as in Table 1. For the silica particles, colloidal silica having the secondary particle size (average secondary particle size) [nm] and silanol group density [pieces/nm$^2$] illustrated in Table 1 was used. The polishing compositions had a pH of 10.3 in these examples.

Using the same colloidal silica as in that of the polishing compositions according to these examples, the adsorption ratio parameter A of AEP was measured by the above-stated procedure. Table 1 illustrates the result.

Examples 8 and 9, Comparative Examples 3 and 4

The polishing compositions according to these examples were prepared similarly to Example 4 other than that their basic compounds were changed as illustrated in Table 1. In Table 1, BAPP denotes 1,4-bis(3-aminopropyl)piperazine, TBAH denotes tetrabutylammonium hydroxide, PIZ denotes piperazine, and TMAH denotes tetramethylammonium hydroxide.

<Evaluation of Polishing Removal Rate>

The polishing compositions according to these examples were used as the polishing liquid without any treatment, and polishing test was performed to a silicon wafer. Then the polishing removal rate of silicon was evaluated. For a test piece, a silicon wafer of 300 mm in diameter (conductive type: P type, crystal orientation: <100>, resistivity: not less than 0.1 Ω·cm and less than 100 Ω·cm) was prepared so that the surface roughness was 0.5 nm to 1.5 nm by a double-side polisher. Then, this was cleaned and dried, and cut into square of 60 mm in one side.

This test piece was polished by the following conditions:

[Polishing Conditions]

Polishing machine: A single-side polishing machine, model "EJ-380IN" manufactured by Engis Japan Corporation.

Polishing pad: Product name "MH S-15A", manufactured by Nitta Haas Incorporated.

Polishing pressure: 250 g/cm$^2$

Number of rotations of platen: 50 rpm

Number of rotations of head: 50 rpm

Feeding rate of polishing liquid: 100 mL/min·test piece (use in recycle of polishing liquid of 500 mL)

Temperature of polishing liquid: 25° C.

Polishing was performed for 10 minutes per 1 batch while using the polishing liquid in recycle by the polishing conditions as stated above. After the polishing for 10 minutes, the pad was dressed using a brush for 1 minute while letting pure water flowing over so as to remove the composition left on the pad after the polishing. This was performed continuously for 10 batches. Then, the polishing removal rate [μm/min.] was calculated for each of the first batch and the tenth batch by the following calculating expressions (1) and (2):

Polishing removal[cm]=difference in weight of the silicon wafer before and after polishing[g]/density of silicon[g/cm$^3$](=2.33 g/cm$^3$)/area to be polished[cm$^2$](=36 cm$^2$); and    (1)

Polishing removal rate[μm/min.]=polishing removal [cm]×10$^4$/polishing time(=10 min.).    (2)

For each example, the ratio of polishing removal rate of the tenth batch to the first batch (polishing removal rate ratio) was calculated. A larger value of this polishing removal rate ratio (closer to 1) means that the polishing liquid has a nature suitable for use in recycle, specifically, decrease in the polishing removal rate due to use in recycle (recycle use) is small.

TABLE 1

|  | Silica particles | | Basic compound | | | 1st batch polishing removal rate [nm/min] | 10th batch polishing removal rate [nm/min] | Polishing removal rate ratio 10th batch/ 1st batch |
|---|---|---|---|---|---|---|---|---|
|  | Particle size [nm] | Content [wt %] | Silanol group density [pieces/ nm$^2$] | Types | Content [wt %] | Adsorption ratio parameter A | | |
| Ex. 1 | 25 | 0.6 | 2.2 | AEP | 0.2 | 1.00 | 0.32 | 0.27 | 0.84 |
| Ex. 2 | 40 | 0.6 | 2.2 | AEP | 0.2 | 1.00 | 0.37 | 0.31 | 0.84 |
| Ex. 3 | 51 | 0.6 | 2.2 | AEP | 0.2 | 1.00 | 0.38 | 0.31 | 0.82 |
| Ex. 4 | 72 | 0.6 | 2.2 | AEP | 0.2 | 1.00 | 0.40 | 0.34 | 0.85 |
| Ex. 5 | 100 | 0.6 | 2.2 | AEP | 0.2 | 1.00 | 0.37 | 0.30 | 0.81 |
| Ex. 6 | 72 | 0.6 | 3.3 | AEP | 0.2 | 1.00 | 0.38 | 0.31 | 0.82 |
| Ex. 7 | 75 | 0.6 | 5.1 | AEP | 0.2 | 1.00 | 0.32 | 0.24 | 0.75 |
| Ex. 8 | 72 | 0.6 | 2.2 | BAPP | 0.2 | 1.04 | 0.35 | 0.29 | 0.83 |
| Ex. 9 | 72 | 0.6 | 2.2 | TBAH | 0.2 | 1.13 | 0.36 | 0.28 | 0.78 |
| Comp. Ex. 1 | 72 | 0.6 | 1.2 | AEP | 0.2 | 1.00 | 0.28 | 0.23 | 0.82 |
| Comp. Ex. 2 | 72 | 0.6 | 7.5 | AEP | 0.2 | 1.00 | 0.29 | 0.19 | 0.66 |
| Comp. Ex. 3 | 72 | 0.6 | 2.2 | PIZ | 0.2 | 1.57 | 0.40 | 0.23 | 0.58 |
| Comp. Ex. 4 | 72 | 0.6 | 2.2 | TMAH | 0.2 | 1.80 | 0.36 | 0.20 | 0.56 |

As illustrated in Table 1, Examples 1 to 9, using the polishing liquid having the silanol group density of the silica particles that was 1.5 to 6.0 pieces/nm$^2$ and having the adsorption ratio parameter A of the basic compounds that was 1.2 or less, had apparently better ability of keeping the polishing removal rate than in Comparative Examples 3 and 4, using the polishing liquid having the adsorption ratio parameter A exceeding 1.2. Examples 1 to 6, using the polishing liquid of the silanol group density of 1.5 to 4.0 pieces/nm$^2$, had especially good ability of keeping the polishing removal rate. On the contrary, Comparative Example 2, using the polishing liquid of the silanol group density that was larger than 6.0 pieces/nm$^2$, had low ability of keeping the polishing removal rate, and the initial polishing removal rate (first batch) also was low. Comparative Example 1, using the polishing liquid of the silanol group density that was smaller than 1.5 pieces/nm$^2$, also had low initial polishing removal rate. According to the polishing liquid of Examples 1 to 9, their initial polishing removal rate was high and the polishing removal rate ratio also was large. Therefore, they successfully kept a good polishing removal rate stably, and so polished substrates effectively. Since the effect was obtained even when the types of basic compound as the polishing removal accelerator was changed, the polishing compositions satisfying the silanol group density and the adsorption ratio parameter A as stated above presumably are effective for various types of basic compounds. From these results, AEP and BAPP are especially preferable for the polishing removal accelerator, and of them, AEP is preferable.

Specific examples of the present invention have been described in detail hereinbefore, but they are merely illustrative examples, and are not intended to limit the scope of claims. The techniques described in claims include various modifications and changes of the above exemplified specific examples.

The invention claimed is:

1. A polishing composition, comprising silica particles as abrasives and a basic compound as polishing removal accelerator, wherein
a density of silanol groups of the silica particles is 1.5 to 6.0 pieces/nm$^2$,
an adsorption ratio parameter A of the polishing composition is 1.2 or less, the adsorption ratio parameter A represents concentration dependency of an amount of adsorption of the basic compound to the silica particles as a ratio of high-concentration adsorption amount/ low-concentration adsorption amount, and
the polishing composition has a pH of 8 to 12.

2. The polishing composition according to claim 1, wherein the adsorption ratio parameter A is 1.1 or less.

3. The polishing composition according to claim 1, wherein a density of silanol groups of the silica particles is 1.5 to 4.0 pieces/nm$^2$.

4. The polishing composition according to claim 1, wherein the basic compound includes one type or two types or more of compounds selected from the group consisting of the following general formula (A) and general formula (B):

[General Formula (A)]

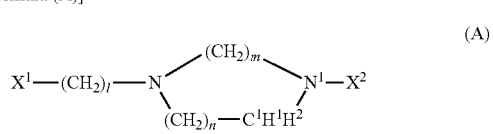

[General Formula (B)]

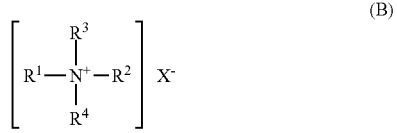

in the general formula (A), $X^1$ denotes a hydrogen atom, an amino group, or a bond to $C^1$ atom, when $X^1$ denotes a bond to $C^1$ atom, $H^1$ atom is not present and $X^2$ denotes a hydrogen atom, an amino group, an aminoalkyl group or a bond to $C^1$ atom, when $X^2$ denotes a bond to $C^1$ atom, a $C^1$—$N^1$ bond is a double bond and $H^2$ atom is not present, l denotes an integer from 1 to 6, m denotes an integer from 1 to 4, and n denotes an integer from 0 to 4, and in the general formula (B), $R^1$ to $R^4$ are selected independently from the group consisting of an alkyl group having the number of carbon atom of 8 or less, a hydroxyalkyl group having the number of carbon atom of 8 or less and an optionally substituted aryl group, and X– is an anion.

5. The polishing composition according to claim 4, comprising aminoalkylpiperazine as a compound represented by the general formula (A).

6. The polishing composition according to claim 1, wherein the polishing composition does not include oxidant substantially.

7. The polishing composition according to claim 1, wherein the silica particles comprise colloidal silica.

8. The polishing composition according to claim 1, wherein the polishing composition is used for polishing of a silicon wafer.

9. The polishing composition according to claim 2, wherein a density of silanol groups of the silica particles is 1.5 to 4.0 pieces/nm$^2$.

10. The polishing composition according to claim 2, wherein the basic compound includes one type or two types or more of compounds selected from the group consisting of the following general formula (A) and general formula (B):

[General Formula (A)]

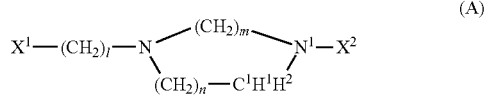

[General Formula (B)]

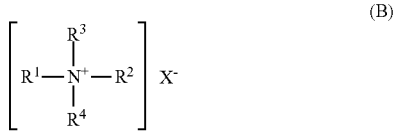

in the general formula (A), $X^1$ denotes a hydrogen atom, an amino group, or a bond to $C^1$ atom, when $X^1$ denotes a bond to $C^1$ atom, $H^1$ atom is not present and $X^2$ denotes a hydrogen atom, an amino group, an aminoalkyl group or a bond to $C^1$ atom, when $X^2$ denotes a bond to $C^1$ atom, a $C^1$—$N^1$ bond is a double bond and $H^2$ atom is not present, l denotes an integer from 1 to 6, m denotes an integer from 1 to 4, and n denotes an integer from 0 to 4, and in the general formula (B), $R^1$ to $R^4$ are selected independently from the group consisting of an alkyl group having the number of carbon atom of 8 or less, a hydroxyalkyl group having the number of carbon atom of 8 or less and an optionally substituted aryl group, and X– is an anion.

11. The polishing composition according to claim 3, wherein
the basic compound includes one type or two types or more of compounds selected from the group consisting of the following general formula (A) and general formula (B):

[General Formula (A)]

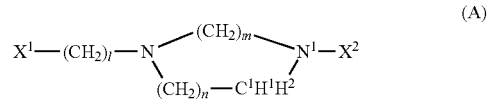

[General Formula (B)]

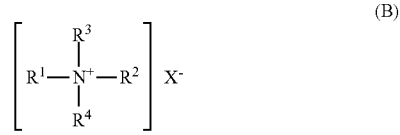

in the general formula (A), $X^1$ denotes a hydrogen atom, an amino group, or a bond to $C^1$ atom, when $X^1$ denotes a bond to $C^1$ atom, $H^1$ atom is not present and $X^2$ denotes a hydrogen atom, an amino group, an aminoalkyl group or a bond to $C^1$ atom, when $X^2$ denotes a bond to $C^1$ atom, a $C^1$—$N^1$ bond is a double bond and $H^2$ atom is not present, l denotes an integer from 1 to 6, m denotes an integer from 1 to 4, and n denotes an integer from 0 to 4, and in the general formula (B), $R^1$ to $R^4$ are selected independently from the group consisting of an alkyl group having the number of carbon atom of 8 or less, a hydroxyalkyl group having the number of carbon atom of 8 or less and an optionally substituted aryl group, and X– is an anion.

12. The polishing composition according to claim 2, wherein the polishing composition does not include oxidant substantially.

13. The polishing composition according to claim 3, wherein the polishing composition does not include oxidant substantially.

14. The polishing composition according to claim 4, wherein the polishing composition does not include oxidant substantially.

15. The polishing composition according to claim 5, wherein the polishing composition does not include oxidant substantially.

16. The polishing composition according to claim 1, wherein 50% by weight or more of the basic compound included in the polishing composition is an organic basic compound.

17. The polishing composition according to claim 1, wherein the amount of the polishing removal accelerator included in the polishing composition is 50g to 1000g per abrasives of 1kg.

18. The polishing composition according to claim 1, wherein the polishing composition comprises chelating agent.

19. The polishing composition according to claim 1, wherein the polishing composition comprises water-soluble polymer.

20. The polishing composition according to claim 1, wherein the polishing composition comprises surfactant.

* * * * *